(12) United States Patent
Tamura et al.

(10) Patent No.: US 7,173,277 B2
(45) Date of Patent: Feb. 6, 2007

(54) SEMICONDUCTOR LIGHT EMITTING DEVICE AND METHOD FOR FABRICATING THE SAME

(75) Inventors: Satoshi Tamura, Osaka (JP); Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 56 days.

(21) Appl. No.: 10/717,557

(22) Filed: Nov. 21, 2003

(65) Prior Publication Data

US 2004/0113156 A1    Jun. 17, 2004

(30) Foreign Application Priority Data

Nov. 27, 2002    (JP)    ............................. 2002-343345

(51) Int. Cl.
*H01L 29/04*    (2006.01)
*H01L 29/24*    (2006.01)
*H01L 27/15*    (2006.01)

(52) U.S. Cl. ........................... 257/59; 257/102; 257/79

(58) Field of Classification Search ................. 257/59, 257/79, 102
See application file for complete search history.

(56) References Cited

U.S. PATENT DOCUMENTS 5,451,474 A * 9/1995 Wu et al. .................... 429/59
6,287,947 B1   9/2001 Ludowise et al.

2003/0231683 A1 * 12/2003 Chua et al. .................... 372/46

FOREIGN PATENT DOCUMENTS

| JP | 05-013811 | 1/1993 |
|---|---|---|
| JP | 7-94782 A | 4/1995 |
| JP | 07-302770 | 11/1995 |
| JP | 09-033223 | 2/1997 |
| JP | 10-173224 A | 6/1998 |
| JP | 10-308533 | 11/1998 |
| JP | 11-274554 | 10/1999 |
| JP | 11-298040 | 10/1999 |
| JP | 2000-5891 A | 1/2000 |
| JP | 2000-058911 A | 2/2000 |
| JP | 2000-216431 A | 8/2000 |
| JP | 2000-228563 A | 8/2000 |

* cited by examiner

*Primary Examiner*—Zandra V. Smith
*Assistant Examiner*—Kiesha Rose
(74) *Attorney, Agent, or Firm*—McDermott Will & Emery LLP

(57) ABSTRACT

A semiconductor light emitting device includes a semiconductor multilayer structure comprising a plurality of Group III–V nitride semiconductor layers including two semiconductor layers of different conductivity types, and a transparent electrode formed on the semiconductor multilayer structure. The transparent electrode contains an impurity element developing the same conductivity type as that of an impurity element introduced into a semiconductor in the semiconductor multilayer structure, which semiconductor has an interface with the transparent electrode. Therefore, contact resistance between the transparent electrode and the semiconductor having the interface with the transparent electrode is decreased.

7 Claims, 18 Drawing Sheets

SEMICONDUCTOR LIGHT EMITTING DEVICE AND METHOD FOR FABRICATING THE SAME

BACKGROUND OF THE INVENTION

The present invention relates to semiconductor light emitting devices made of Group III–V nitride semiconductors, which are capable of emitting light in the blue to ultraviolet regions.

Recently, light emitting diodes (GaN-based LEDs), using a Group III–V nitride (hereinafter, referred to simply as a "nitride") expressed by a general formula $B_z Al_x Ga_{1-x-y-z} In_y N$, where $0 \leq x \leq 1$, $0 \leq y \leq 1$, $0 \leq z \leq 1$, and $x+y+z=1$, have found wide application in various kinds of display panels, large display apparatus and traffic lights, for example. White LEDs, in which a GaN-based LED is combined with a fluorescent substance, have also been put into practical use, and are expected to replace the currently used lighting equipment, if their luminous efficiency is improved in the future.

FIG. 18 illustrates a cross-sectional structure of a known blue light emitting diode in which nitride semiconductors are used (See Japanese Laid-Open Publication Nos. 07-094782, 10-173224, and 2000-5891.) As shown in FIG. 18, in the known blue light emitting diode, a first semiconductor layer 102 made of an n-type nitride semiconductor, and a second semiconductor layer 103 made of a p-type nitride semiconductor are sequentially stacked on a substrate 101 made of sapphire.

A first electrode 104 made of nickel and gold with a thickness of from about 2 nm to about 5 nm is formed on the second semiconductor layer 103. The first electrode 104 can make a good ohmic contact with the p-type nitride semiconductor.

A second electrode 105 made of gold is formed on the first electrode 104. The second electrode 105, which is for wire bonding, passes through the first electrode 104 to reach the second semiconductor layer 103. An n-type ohmic electrode 106 is formed on an exposed portion of the first semiconductor layer 102.

With this structure, in the known blue light emitting diode, recombination radiation (generated light), emitted by the pn junction formed by the interface between the first and second semiconductor layers 102 and 103, is transmitted through the second semiconductor layer 103 and the first electrode 104, and then extracted.

However, a problem with the known blue light emitting diode is that the recombination radiation produced by the pn junction is partially absorbed by the first electrode 104 made of the metals. To deal with this problem, if the thickness of the first electrode 104 is reduced significantly, the amount of radiation transmitting through the first electrode 104 can be increased. In that case, however, a trade-off occurs in which series resistance (sheet resistance) in the first electrode 104 is increased, which makes it difficult to significantly increase the optical electric characteristics of the device, that is, the device characteristics.

Alternatively, instead of the metals, transparent material may be used to form the first electrode 104 in order to increase the light-extraction efficiency. Nevertheless, a problem also arises in this case, in which contact resistance between the p-type nitride semiconductor layer and the transparent electrode formed thereon is large.

In addition, there is another problem in that nitride semiconductors, in which the activation ratio of an impurity, particularly of a p-type impurity, that determines the conductivity type of the semiconductor is small, have large sheet resistance.

SUMMARY OF THE INVENTION

In view of the above-mentioned problems, it is therefore an object of the present invention to decrease contact resistance with respect to a transparent electrode in a nitride semiconductor device.

In order to achieve the above object, an inventive semiconductor light emitting device employs a structure in which a transparent electrode that has an interface with a nitride semiconductor layer is doped with an impurity developing the same conductivity type as that of an impurity introduced into the nitride semiconductor layer, or is doped with a metal that can adsorb hydrogen.

Further, in order to achieve the above object, an inventive semiconductor light emitting device employs a structure in which a passivation film that has an interface with a nitride semiconductor layer is doped with an impurity developing the same conductivity type as that of an impurity introduced into the nitride semiconductor layer, or is doped with a metal that can adsorb hydrogen.

Specifically, a first inventive semiconductor light emitting device includes a semiconductor multilayer structure comprising a plurality of Group III–V nitride semiconductor layers including two semiconductor layers of different conductivity types, and a transparent electrode formed on the semiconductor multilayer structure. The transparent electrode contains an impurity element developing the same conductivity type as that of an impurity element introduced into a semiconductor in the semiconductor multilayer structure. The semiconductor has an interface with the transparent electrode.

In the first inventive semiconductor light emitting device, the impurity element contained in the transparent electrode is diffused into the semiconductor layer having the interface with the transparent electrode by a heat treatment performed during the fabrication process, so that the impurity element diffused from the transparent electrode into the semiconductor layer causes a decrease in the value of resistance in the semiconductor layer where the semiconductor layer is near the interface with the transparent electrode. Thus, the contact resistance of the semiconductor layer with respect to the transparent electrode is decreased.

A second inventive semiconductor light emitting device includes a semiconductor multilayer structure comprising a plurality of Group III–V nitride semiconductor layers including two semiconductor layers of different conductivity types, and a transparent electrode formed on the semiconductor multilayer structure. The transparent electrode contains a metal element that adsorbs hydrogen.

In the second inventive semiconductor light emitting device, when the metal element that adsorbs hydrogen, contained in the transparent electrode, is diffused into a semiconductor layer having an interface with the transparent electrode by a heat treatment performed during the fabrication process, the metal element that adsorbs hydrogen, diffused from the transparent electrode into the semiconductor layer, adsorbs (binds to) the hydrogen atoms that have been bound to an impurity element introduced into the semiconductor layer. This increases the activation ratio of the impurity element introduced into the semiconductor layer where the semiconductor layer is near the interface with the transparent electrode, resulting in a decrease in the resistance of the semiconductor layer. Accordingly, the contact resistance of the semiconductor layer with respect to the transparent electrode is reduced.

A third inventive semiconductor light emitting device includes a semiconductor multilayer structure comprising a plurality of Group III–V nitride semiconductor layers including two semiconductor layers of different conductivity types, and a passivation film formed on the semiconductor multilayer structure. The passivation film contains an impurity element developing the same conductivity type as that of an impurity element introduced into a semiconductor in the semiconductor multilayer structure. The semiconductor has an interface with the passivation film.

In the third inventive semiconductor light emitting device, the impurity element contained in the passivation film is diffused into the semiconductor layer having the interface with the passivation film by a heat treatment performed during the fabrication process, so that the impurity element diffused into the semiconductor layer from the passivation film causes a reduction in the value of resistance in the semiconductor layer where the semiconductor layer is near the interface with the passivation film. As a result, the value of resistance (sheet resistance) in the upper portion of the semiconductor layer is allowed to be small.

A fourth inventive semiconductor light emitting device includes a semiconductor multilayer structure comprising a plurality of Group III–V nitride semiconductor layers including two semiconductor layers of different conductivity types, and a passivation film formed on the semiconductor multilayer structure. The passivation film contains a metal element that adsorbs hydrogen.

In the fourth inventive semiconductor light emitting device, when the metal element contained in the passivation film is diffused into a semiconductor layer having an interface with the passivation film by a heat treatment performed during the fabrication process, the metal element that adsorbs hydrogen, diffused from the passivation film into the semiconductor layer, adsorbs (binds to) the hydrogen atoms that have been bound to an impurity element introduced into the semiconductor layer. This increases the activation ratio of the impurity element introduced into the semiconductor layer where the semiconductor layer is near the interface with the passivation film, resulting in a decrease in the value of resistance in the semiconductor layer. Accordingly, the value of resistance (sheet resistance) in the upper portion of the semiconductor layer is reduced.

In the first or third inventive semiconductor light emitting device, the impurity elements are preferably magnesium, zinc, beryllium, or silicon.

In the second or fourth inventive semiconductor light emitting device, the metal element is preferably nickel, palladium, or platinum.

The third or fourth inventive semiconductor light emitting device preferably further includes a transparent electrode formed on the semiconductor multilayer structure where the passivation film is not formed.

In the first through fourth inventive semiconductor light emitting devices, the transparent electrode is preferably made of indium tin oxide or gallium oxide.

Further, the first through fourth inventive semiconductor light emitting devices preferably further include, on the transparent electrode, a multilayer film that reflects light emitted from the semiconductor multilayer structure, and includes a plurality of dielectric layers.

The first through fourth inventive semiconductor light emitting devices preferably further include a multilayer film, which is formed to the side of the semiconductor multilayer structure opposite to the transparent electrode, and which reflects light emitted from the semiconductor multilayer structure, and includes a plurality of dielectric layers or a plurality of semiconductor layers.

In this case, the multilayer film is preferably made of at least two substances among silicon oxide, silicon nitride, niobium oxide, hafnium oxide, titanium oxide and tantalum oxide.

A first inventive method for fabricating a semiconductor light emitting device includes the steps of forming, on a substrate, a semiconductor multilayer structure comprising a plurality of Group III–V nitride semiconductor layers including two semiconductor layers of different conductivity types; and forming a transparent electrode on an electrode-formation face of the semiconductor multilayer structure by using material that contains an impurity element developing the same conductivity type as that of an impurity element introduced into a semiconductor having the electrode-formation face, and then heat-treating the transparent electrode.

In accordance with the first inventive semiconductor-light-emitting-device fabrication method, the impurity element contained in the transparent electrode formed on the semiconductor multilayer structure is diffused into the semiconductor layer having the interface with the transparent electrode by the heat treatment. The impurity element diffused from the transparent electrode into the semiconductor layer causes a reduction in the value of resistance in the semiconductor layer where the semiconductor layer is near the interface with the transparent electrode. Accordingly, the contact resistance of the semiconductor layer with respect to the transparent electrode is permitted to be small.

A second method for fabricating a semiconductor light emitting device includes the steps of forming, on a substrate, a semiconductor multilayer structure comprising a plurality of Group III–V nitride semiconductor layers including two semiconductor layers of different conductivity types; and forming a transparent electrode on the semiconductor multilayer structure by using material that contains a metal element that adsorbs hydrogen, and then heat-treating the transparent electrode.

According to the second inventive semiconductor-light-emitting-device fabrication method, the metal element that adsorbs hydrogen, contained in the transparent electrode formed on the semiconductor multilayer structure, is diffused into a semiconductor layer having an interface with the transparent electrode by the heat treatment. The metal element that adsorbs hydrogen, diffused from the transparent electrode into the semiconductor layer, adsorbs (binds to) the hydrogen atoms that have been bound to an impurity element introduced into the semiconductor layer. This increases the activation ratio of the impurity element introduced into the semiconductor layer where the semiconductor layer is near the interface with the transparent electrode, leading to a decrease in the resistance of the semiconductor layer. As a result, the contact resistance of the semiconductor layer with respect to the transparent electrode is reduced.

The first or second inventive semiconductor-light-emitting-device fabrication method preferably further includes, before the transparent-electrode formation step, the steps of: forming a passivation film on the semiconductor multilayer structure, and removing from the passivation film a portion in which the transparent electrode is to be formed. The passivation film is preferably formed using material that contains an impurity element developing the same conductivity type as that of an impurity element introduced into a semiconductor in the semiconductor multilayer structure. The semiconductor has an interface with the passivation film.

The first or second inventive semiconductor-light-emitting-device fabrication method preferably further includes, before the transparent-electrode formation step, the steps of: forming a passivation film on the semiconductor multilayer structure, and removing from the passivation film a portion in which the transparent electrode is to be formed. The passivation film is preferably formed using material that contains a metal element that adsorbs hydrogen.

A third inventive method for fabricating a semiconductor light emitting device includes the steps of: forming, on a substrate, a semiconductor multilayer structure comprising a plurality of Group III–V nitride semiconductor layers including two semiconductor layers of different conductivity types; forming a first electrode made of metal on the semiconductor multilayer structure; removing the substrate from the semiconductor multilayer structure; and forming a transparent electrode on a second-electrode-formation face of the semiconductor multilayer structure by using material that contains an impurity element developing the same conductivity type as that of an impurity element introduced into a semiconductor having the second-electrode-formation face, wherein the second-electrode-formation face opposes the first electrode, and then heat-treating the transparent electrode.

In accordance with the third inventive semiconductor-light-emitting-device fabrication method, even in a case where unconductive insulative material such as sapphire is used as the material for the substrate, it is possible to respectively form a first electrode and a second electrode on the upper and lower faces of the semiconductor multilayer structure so that the first and second electrodes oppose each other. In addition, the impurity element diffused from the transparent electrode into the semiconductor layer having the interface with the transparent electrode causes a reduction in the value of resistance in the semiconductor layer where the semiconductor layer is in the vicinity of the interface with the transparent electrode. Accordingly, the contact resistance of the semiconductor layer with respect to the transparent electrode is allowed to be small.

BRIEF DESCRIPTION OF THE DRAWINGS

FIG. 1A illustrates the plan configuration, while FIG. 1B illustrates the cross-sectional view taken along the line Ib—Ib of FIG. 1A.

DESCRIPTION OF THE PREFERRED EMBODIMENTS (First Embodiment)

Hereinafter, a first embodiment of the present invention will be described with reference to the accompanying drawings.

Figure 1A:
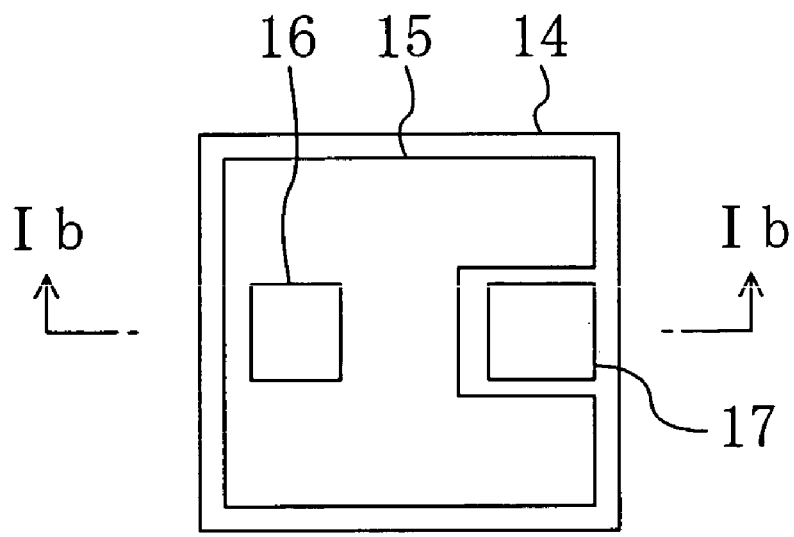
FIGS. 1A and 1B illustrate a blue light emitting diode in accordance with a first embodiment of the present invention.
Figure 1B:
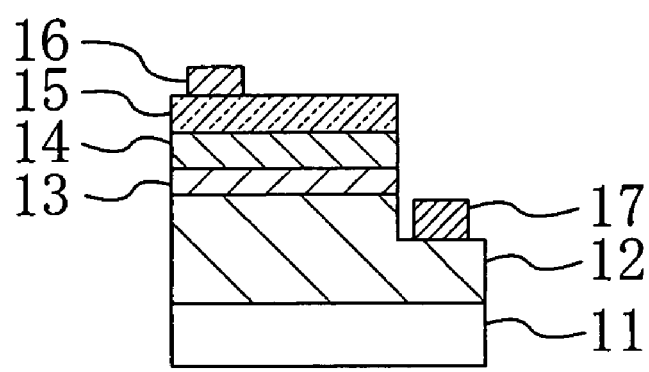

FIGS. 1A and 1B illustrate a blue light emitting diode in accordance with the first embodiment of the present invention. FIG. 1A illustrates the plan configuration, while FIG. 1B illustrates the cross-sectional structure taken along the line Ib—Ib of FIG. 1A.

As shown in FIGS. 1A and 1B, a first semiconductor layer 12, a multi-quantum well (MQW) active layer 13, and a second semiconductor layer 14 are sequentially formed on a substrate 11 made of sapphire, for example. The first semiconductor layer 12 is made of n-type gallium nitride (GaN) having a thickness of about 4 μm and a carrier density of about $1 \times 10^{17}$ cm$^2$. The MQW active layer 13 is formed by stacking three pairs of an about 7 nm thick barrier layer of GaN and an about 3 nm thick well layer of $In_{0.3}Ga_{0.7}N$. The second semiconductor layer 14 is made of p-type gallium nitride (GaN) having a thickness of about 0.8 μm and a carrier density of about $1 \times 10^{18}$ cm$^2$.

A transparent electrode 15 having a thickness of about 100 nm and made of indium tin oxide (ITO) is formed on the second semiconductor layer 14.

A bonding pad 16 of gold (Au) is formed selectively on the transparent electrode 15, and an n-type ohmic electrode 17, made of a multilayer structure of titanium (Ti) and gold (Au), is formed on a selectively exposed portion of the first semiconductor layer 12.

By this structure, blue light, generated and emitted from the MQW active layer 13, and passing through the second semiconductor layer 14 and the transparent electrode 15, is taken out to the exterior.

The first embodiment is characterized in that the impurity element introduced into the ITO that forms the transparent electrode 15 is magnesium (Mg), which is the impurity element introduced into the p-type second semiconductor layer 14. As will be described later, the magnesium introduced into the ITO is diffused into the second semiconductor layer 14 by an annealing performed during fabrication process, causing contact resistance between the second semiconductor layer 14 and the transparent electrode 15 to decrease.

It should be noted that the impurity element to introduce into the transparent electrode 15 is not limited to magnesium, but zinc (Zn), beryllium (Be), or any other dopant that makes the conductivity type of gallium nitride be p-type, may be used.

In addition, instead of the MQW active layer 13, a single-quantum well (SQW) active layer of indium gallium nitride with a thickness of about 20 nm may be provided.

Moreover, as shown in FIG. 1A, since the transparent electrode 15 is conductive, the location and shape of the electrode may be determined arbitrarily.

As described above, in the first embodiment, magnesium, which is the impurity element introduced into the p-type second semiconductor layer 14, is introduced into the transparent electrode 15. Therefore, contact resistance between the second semiconductor layer 14 and the transparent electrode 15 is decreased, thereby allowing the operating voltage to be reduced.

Hereinafter, referring to the accompanying drawings, it will be described how to fabricate a blue light emitting diode having the above-mentioned structure.

FIGS. 2A through 2C and FIGS. 3A and 3B are cross-sectional views illustrating sequential process steps for fabricating a blue light emitting diode in accordance with the first embodiment of the present invention.

Figure 2A:
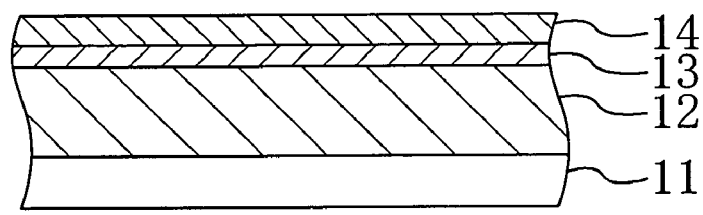
FIGS. 2A through 2C are cross-sectional views illustrating sequential process steps for fabricating the blue light emitting diode in accordance with the first embodiment of the present invention.

First, as shown in FIG. 2A, a low-temperature buffer layer (not shown) made of gallium nitride is grown on a substrate 11 made of sapphire by a metal organic vapor phase epitaxy (MOVPE) process. The substrate 11 is about 5.1 cm (=2 inches) in diameter, and the plane orientation of the principal surface thereof is a (0001) plane. In the MOVPE process, trimethylgallium (TMG) is used as a gallium source, ammonia ($NH_3$) is used as a nitrogen source, and hydrogen ($H_2$) is used as a carrier gas, while the growth temperature is set at about 500° C. The buffer layer buffers a lattice mismatch between the sapphire and a first semiconductor layer 12, for example, grown on the sapphire. Subsequently, while mono-silane ($SiH_4$), which is a source material containing silicon serving as a donor impurity, is introduced, and with the growth temperature being set to about 1030° C., the first semiconductor layer 12 made of n-type gallium nitride with a thickness of about 4 μm is grown on the low-temperature buffer layer. Then, the supply of the mono-silane is stopped, and a barrier layer made of gallium nitride with a thickness of about 7 nm is grown on the first semiconductor layer 12.

The carrier gas is then changed to nitrogen ($N_2$), and at the same time the growth temperature is lowered to about 800° C., and while trimethylindium (TMI) as an indium source is also supplied, a well layer is grown on the barrier layer. The well layer has a thickness of about 3 nm, and is made of indium gallium nitride, in which indium proportion is 30%. The barrier layer and the well layer are grown alternately in three pairs, thereby forming a MQW active layer 13. By this quantum well structure, the MQW active layer 13 generates blue light with a wavelength of about 470 nm. As mentioned above, when the barrier layers of gallium nitride are grown, hydrogen is used as the carrier gas, and the growth temperature is set at about 1030° C. On the other hand, when the well layers of indium gallium nitride are grown, nitrogen is used as the carrier gas, and the growth temperature is set at about 800° C.

Next, cyclopentadienyl magnesium ($Cp_2Mg$), which is a source material containing magnesium as an acceptor impurity, is introduced into the respective source gases of trimethylgallium and ammonia, and a second semiconductor layer 14 made of p-type gallium nitride with a thickness of about 0.8 μm is grown on the MQW active layer 13. After the second semiconductor layer 14 has been grown, the second semiconductor layer 14 is subjected to an annealing process performed using an annealing furnace for 20 minutes in a nitrogen ambient at a temperature of about 750° C. Through the annealing process, the p-type dopant introduced into the second semiconductor layer 14 is activated, which further reduces the resistance of the second semiconductor layer 14.

Figure 2B:
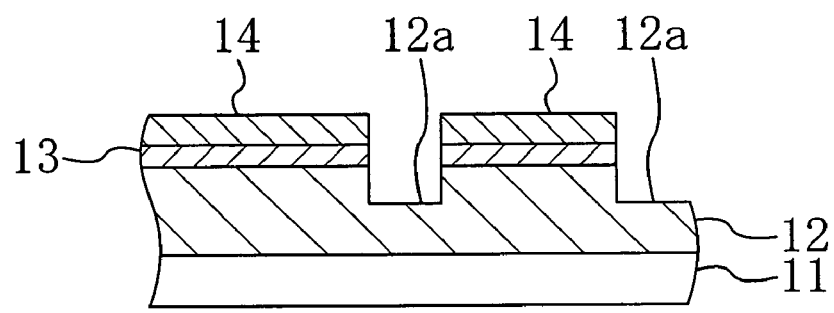

Subsequently, as shown in FIG. 2B, the second semiconductor layer 14, the MQW active layer 13, and upper portions of the first semiconductor layer 12 are removed selectively by dry etching, such as reactive ion etching (RIE) using, e.g., chlorine ($Cl_2$) as an etching gas, or inductively coupled plasma (ICP) etching, thereby forming n-type electrode formation regions 12a in the first semiconductor layer 12.

Figure 2C:
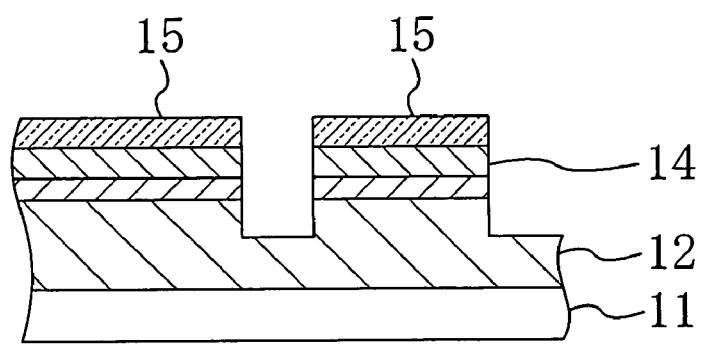

Then, as shown in FIG. 2C, ITO, into which magnesium, i.e., the same impurity element as the p-type dopant in the second semiconductor layer 14, has been introduced, is selectively grown to a thickness of about 100 nm on the second semiconductor layers 14, thereby forming transparent electrodes 15. The ITO may be grown by a sputtering process, a pulsed laser deposition (PLD) method, an electron beam (EB) process, or a sol-gel method, for example. In terms of reducing the resistance of the ITO, a sputtering process or a PLD method is preferable. Further, if a sputtering process or a PLD method is employed, a target material is normally formed by sintering, thus making it easy to introduce an impurity element such as magnesium. Subsequently, after the transparent electrodes 15 have been grown, the transparent electrodes 15 are subjected to an annealing process performed at a temperature of about 500° C. Through the annealing process, part of the magnesium introduced into the ITO is diffused into the second semiconductor layers 14 through the interfaces between the ITO and the second semiconductor layers 14. This leads to a decrease in the value of resistance in the second semiconductor layers 14 where the second semiconductor layers 14 are near the interfaces with the transparent electrodes 15, such that the transparent electrodes 15 having small contact resistance with respect to the second semiconductor layers 14 are formed. In this embodiment, the impurity element to introduce into the ITO is not limited to magnesium, but zinc or beryllium may be used. Nevertheless, magnesium is preferable in terms of activation of the dopant. Further, the transparent electrodes 15 are not limited to ITO, but may be made of any substance that makes the transparent electrodes 15 transparent with respect to emitted light having a wavelength of 470 nm, and tin oxide ($SnO_2$) or zinc oxide (ZnO), for example, may be used.

Figure 3A:
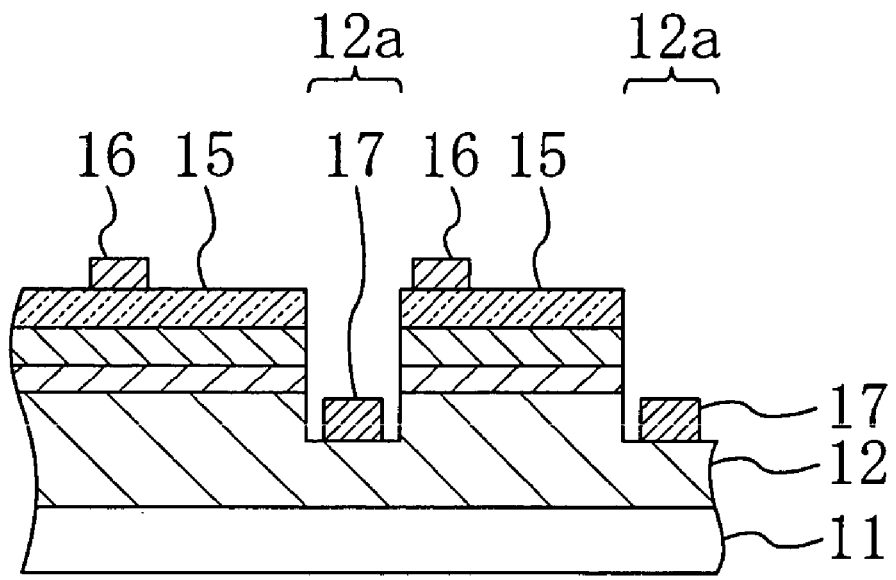
FIGS. 3A and 3B are cross-sectional views illustrating sequential process steps for fabricating the blue light emitting diode in accordance with the first embodiment of the present invention.

Then, as shown in FIG. 3A, bonding pads 16 for wire bonding are selectively formed on the respective transparent electrodes 15. Subsequently, titanium and gold are sequentially grown on the n-type electrode formation regions 12a in the first semiconductor layer 12, thereby forming n-type ohmic electrodes 17.

Figure 3B:
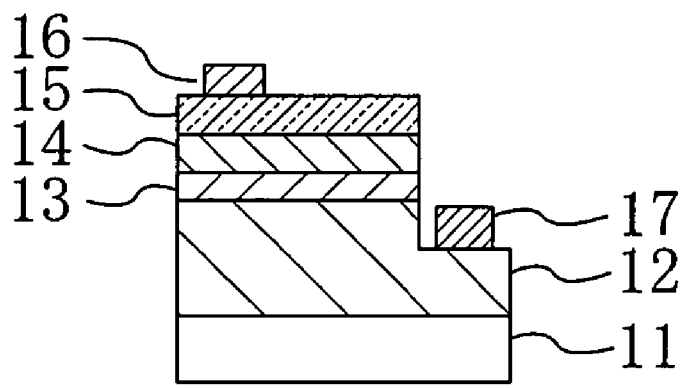

Next, as shown in FIG. 3B, the substrate 11 is divided into chips each about 300 μm square, thereby obtaining blue light emitting diodes.

In this manner, magnesium, that is, the impurity element with which the p-type second semiconductor layers 14 have been doped, is introduced beforehand into the transparent electrodes 15 (p-type electrodes), and diffused through the interfaces into the second semiconductor layers 14 by an annealing process. Therefore, in the resultant blue light emitting diode, in which emitted light is taken out through the p-type second semiconductor layer 14, the contact resistance of the transparent electrode 15 with respect to the second semiconductor layer 14 is allowed to be small, so that the second semiconductor layer 14 has small resistance near its interface with the transparent electrode 15. As a result, it is possible to lower the operating voltage.

First Modified Example of the First Embodiment

In the first embodiment, a dopant that makes the conductivity type of gallium nitride be p-type is introduced into the transparent material (ITO) that forms the transparent electrodes 15. However, in addition to the p-type dopant, a metal element that tends to adsorb (bind to) hydrogen atoms, e.g., nickel (Ni), palladium (Pd), or platinum (Pt), may be introduced. In that case, in order to form the transparent electrodes 15, a metal element, such as nickel, that easily adsorbs hydrogen atoms may be introduced beforehand into the target material for growing the transparent electrodes 15.

Normally, a p-type dopant introduced into a p-type gallium nitride semiconductor tends to bind to hydrogen atoms, causing the p-type dopant to be deactivated. In view of this, if metal atoms that easily adsorb hydrogen atoms are diffused into the p-type semiconductor layer through the transparent electrode 15, the metal atoms diffused into the p-type semiconductor layer attract the hydrogen atoms that have been taken into the p-type semiconductor layer.

In this manner, the metal atoms such as nickel atoms separate the hydrogen atoms that cause the p-type dopant to be deactivated, from the p-type dopant, so that activation of the p-type dopant such as magnesium is facilitated. Therefore, the p-type second semiconductor layer 14 has small resistance where the p-type second semiconductor layer 14 is in the vicinity of the interface with the transparent electrode 15. As a result, it is possible to form the transparent electrode 15 with small contact resistance with respect to the second semiconductor layer 14.

Second Modified Example of the First Embodiment

In the first embodiment, generated light is extracted through the p-type second semiconductor layer 14. However, a flip-chip device, in which generated light is taken out through a substrate 11, may be formed.

Figure 4:
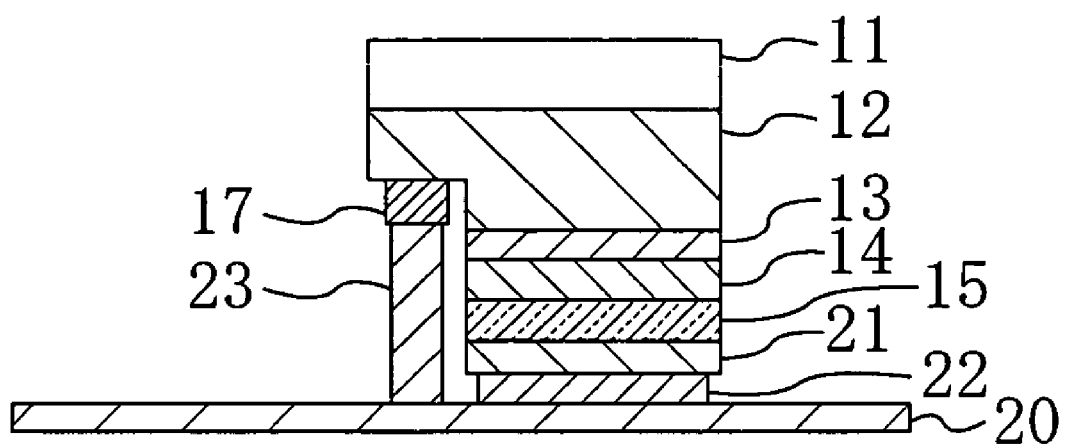
FIG. 4 is a cross-sectional view of a blue light emitting diode in accordance with a second modified example of the first embodiment of the present invention.

As shown in FIG. 4, in a blue light emitting diode, a transparent electrode 15 is secured onto a mounting substrate 20 with a high-reflectance film 21 and a first solder material 22 being interposed therebetween. The high-reflectance film 21 is made of a multilayer film composed of a plurality of dielectrics. Further, an n-type ohmic electrode 17 is secured onto the mounting substrate 20 with a second solder material 23 being interposed therebetween.

In this way, in the blue light emitting diode in accordance with a second modified example, the high-reflectance film 21, instead of the bonding pad 16, is provided on the transparent electrode 15, so that light emitted toward the transparent electrode 15 is reflected by the high-reflectance film 21, and extracted through the substrate 11. In this modified example, the higher the reflectance of the high-reflectance film 21 the better, and it is preferable that the reflectance is at least 70% or more.

(Second Embodiment)

Hereinafter, a second embodiment of the present invention will be described with reference to the accompanying drawings.

Figure 5:
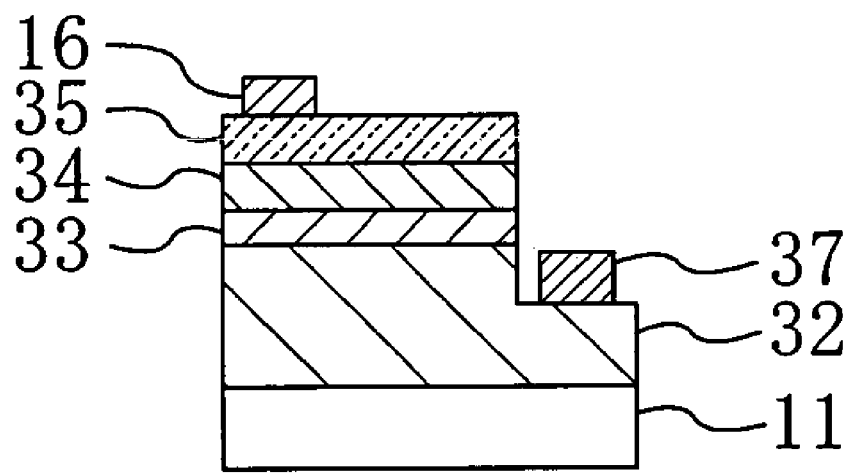
FIG. 5 is a cross-sectional view of an ultraviolet light emitting diode in accordance with a second embodiment of the present invention.

FIG. 5 illustrates a cross-sectional structure of an ultraviolet light emitting diode in accordance with the second embodiment of the present invention. In FIG. 5, the same members as those shown in FIGS. 1A and 1B are identified by the same reference numerals and the description thereof will be omitted herein.

As shown in FIG. 5, a first semiconductor layer 32, a MQW active layer 33, and a second semiconductor layer 34 are sequentially formed on a substrate 11 made of sapphire, for example. The first semiconductor layer 32 is made of n-type aluminum gallium nitride ($Al_{0.4}Ga_{0.6}N$) having a thickness of about 4 μm and a carrier density of about $1 \times 10^{17}$ $cm^2$. The MQW active layer 33 is formed by stacking three pairs of an about 7 nm thick barrier layer of aluminum gallium nitride ($Al_{0.12}Ga_{0.88}N$) and an about 3 nm thick well layer of GaN. The second semiconductor layer 34 is made of p-type aluminum gallium nitride ($Al_{0.4}Ga_{0.6}N$) having a thickness of about 0.8 μm and a carrier density of about $1 \times 10^{18}$ $cm^2$.

An n-type ohmic electrode 37 made of titanium and aluminum is formed on an exposed portion of the first semiconductor layer 32.

On the second semiconductor layer 34, formed is a transparent electrode 35 having a thickness of about 100 nm and made of gallium oxide ($Ga_2O_3$), into which about 1 mol % of tin (Sn) has been introduced. It is preferable that β-(cubic) gallium oxide be used, in which case the conductivity becomes excellent. Further, the impurity element introduced into the gallium oxide that forms the transparent electrode 35 is magnesium (Mg), which is the impurity element introduced into the p-type second semiconductor layer 34. As in the first embodiment, the magnesium introduced into the gallium oxide is diffused into the second semiconductor layer 34 through an annealing performed during fabrication process, causing contact resistance between the second semiconductor layer 34 and the transparent electrode 35 to be decreased.

ITO, normally used as a transparent electrode, has low transmissivity with respect to ultraviolet light with a wavelength of about 300 nm, and thus is not suitable for a transparent electrode. On the other hand, gallium oxide, particularly β-gallium oxide, into which tin oxide has been introduced, has high transmissivity with respect to ultraviolet light in the 300 nm wavelength range, and is thus suitable for the transparent electrode 35 formed in the ultraviolet light emitting diode in accordance with the second embodiment.

As described above, in the ultraviolet light emitting diode of the second embodiment, since the transparent electrode 35 with high transmissivity is used, light-extraction efficiency is increased. In addition, the impurity developing the same conductivity type as that of the impurity that makes the second semiconductor layer 34 be of p-type, is introduced into the transparent electrode 35, such that contact resistance between the transparent electrode 35 and the second semiconductor layer 34 is small, allowing the operating voltage to be decreased.

It should be noted that the impurity element to introduce into the transparent electrode 35 is not limited to magnesium, but zinc, beryllium, or any other dopant that renders the conductivity of gallium nitride p-type may be used.

Moreover, instead of the MQW active layer 33, a single-quantum well (SQW) active layer of gallium nitride with a thickness of about 20 nm may be provided.

Hereinafter, referring to the accompanying drawings, it will be described how to fabricate an ultraviolet light emitting diode having the above-mentioned structure.

FIGS. 6A through 6C and FIGS. 7A through 7C are cross-sectional views illustrating sequential process steps for fabricating an ultraviolet light emitting diode in accordance with the second embodiment of the present invention.

Figure 6A:
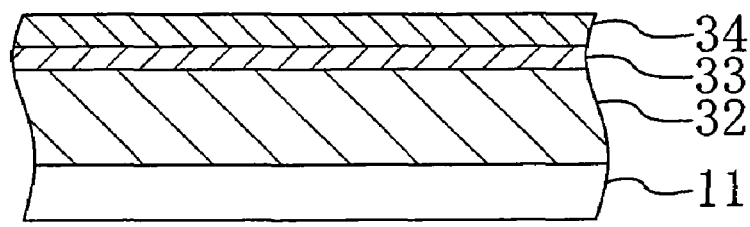
FIGS. 6A through 6C are cross-sectional views illustrating sequential process steps for fabricating the ultraviolet light emitting diode in accordance with the second embodiment of the present invention.

First, as shown in FIG. 6A, a low-temperature buffer layer (not shown) of aluminum gallium nitride is grown on a substrate 11 made of sapphire by a MOVPE process. The substrate 11 is about 5.1 cm in diameter, and the plane orientation of the principal surface thereof is a (0001) plane. In the MOVPE process, trimethylgallium is used as a gallium source, trimethylaluminum is used as an aluminum source, ammonia is used as a nitrogen source, and hydrogen is used as a carrier gas, while the growth temperature is set at about 500° C. The low-temperature buffer layer buffers a lattice mismatch between the sapphire and a first semiconductor layer 32, for example, grown on the sapphire. In this process step, the low-temperature buffer layer may be made of gallium nitride. Subsequently, while mono-silane, which is a source material containing silicon as a donor impurity, is introduced, and with the growth temperature being set at about 1030° C., the first semiconductor layer 32 made of n-type aluminum gallium nitride having a thickness of about 4 μm is grown on the low-temperature buffer layer. Then, the supply of the mono-silane is stopped, and a barrier layer made of aluminum gallium nitride with a thickness of about 7 nm is grown on the first semiconductor layer 32. Thereafter, the supply of the trimethylaluminum as the aluminum source is stopped, and a well layer made of gallium nitride having a thickness of about 3 nm is grown on the barrier layer. The barrier layer and the well layer are grown alternately in three pairs, thereby forming a MQW active layer 33. By this quantum well structure, the MQW active layer 33 generates ultraviolet light with a wavelength of about 360 nm. Then, cyclopentadienyl magnesium, which is a source material containing magnesium as an acceptor impurity, is introduced into the respective source gases of trimethylgallium, trimethylaluminum, and ammonia, and a second semiconductor layer 34 made of p-type aluminum gallium nitride with a thickness of about 0.8 μm is grown on the MQW active layer 33.

Figure 6B:
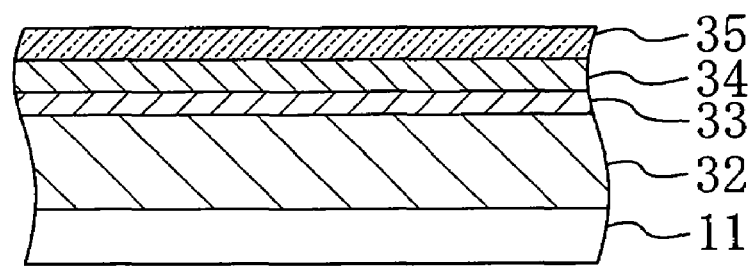

Next, as shown in FIG. 6B, β-gallium oxide is grown to a film thickness of about 100 nm on the second semiconductor layer 34 by a PLD method, for example, thereby forming a transparent electrode 35, wherein tin for making the electrode itself conductive, and magnesium to be diffused into the second semiconductor layer 34 have been introduced into the β-gallium oxide. The gallium oxide film may be grown by a sputtering process, but a PLD method, which gives excellent crystallinity, is preferable. Subsequently, after the transparent electrode 35 has been grown, the second semiconductor layer 34 and the transparent electrode 35 are subjected to an annealing process performed using an annealing furnace for 20 minutes in a nitrogen ambient at a temperature of about 750° C. Through the annealing process, the resistance of the transparent electrode 35 is decreased, while at the same time the p-type dopant in the second semiconductor layer 34, including the p-type dopant diffused from the transparent electrode 35, is activated, thereby further lowering the resistance of the second semiconductor layer 34.

Figure 6C:
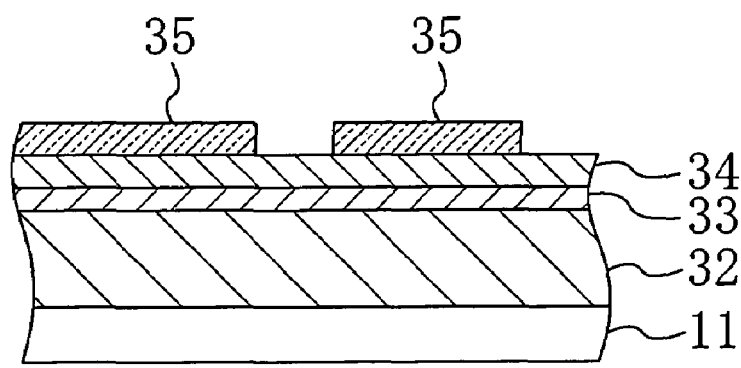

Next, as shown in FIG. 6C, patterning is performed to selectively remove the transparent electrode 35 where the transparent electrode 35 is located above n-type ohmic-electrode formation regions.

Figure 7A:
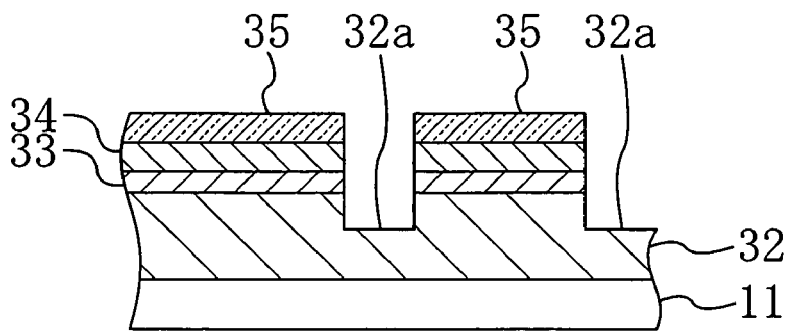
FIGS. 7A through 7C are cross-sectional views illustrating sequential process steps for fabricating the ultraviolet light emitting diode in accordance with the second embodiment of the present invention.

Subsequently, as shown in FIG. 7A, the second semiconductor layer 34, the MQW active layer 33, and upper portions of the first semiconductor layer 32 are selectively removed by dry etching, such as RIE using, e.g., chlorine as an etching gas, or ICP etching, thereby forming n-type electrode formation regions 32a in the first semiconductor layer 32.

Figure 7B:
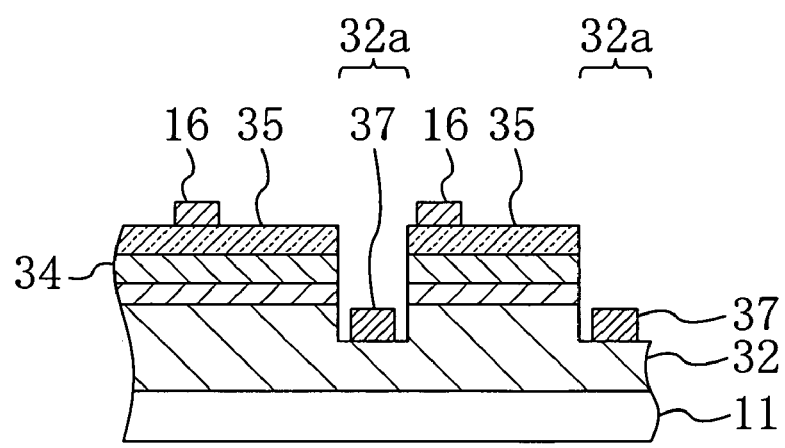

Next, as shown in FIG. 7B, bonding pads 16 for wire bonding are selectively formed on the respective transparent electrodes 35. Titanium and aluminum are then sequentially grown on the n-type electrode formation regions 32a in the first semiconductor layer 32, thereby forming n-type ohmic electrodes 37.

Figure 7C:
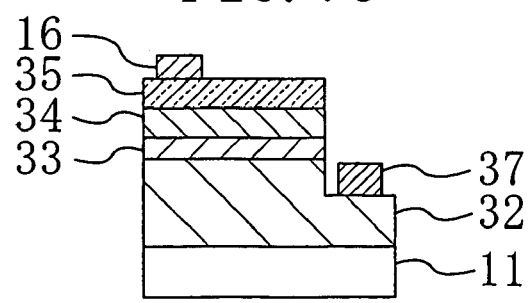

Next, as shown in FIG. 7C, the substrate 11 is divided into chips each about 300 μm square, thereby obtaining ultraviolet light emitting diodes.

As described above, in the fabrication method of the second embodiment, since tin-oxide-added gallium oxide having high transmissivity with respect to ultraviolet light is used to form the transparent electrode 35, the light-extraction efficiency is extremely favorable, resulting in an increase in power conversion efficiency.

Additionally, since magnesium, that is, the p-type impurity element with which the p-type second semiconductor layer 34 has been doped, is introduced into the transparent electrode 35, part of the magnesium is diffused into the second semiconductor layer 34 where the second semiconductor layer 34 is in the vicinity of the interface with the transparent electrode 35 by an annealing process performed after the formation of the transparent electrode 35 as in the first embodiment. This allows the second semiconductor layer 34 to have small resistance near the interface with the transparent electrode 35, thereby reducing contact resistance between the second semiconductor layer 34 and the transparent electrode 35.

It should be noted that the impurity element to introduce into gallium oxide is not limited to magnesium, but zinc, beryllium, or any other dopant that makes aluminum gallium nitride develop p-type conductivity, may be used.

Modified Example of the Second Embodiment

In the second embodiment, a dopant that renders the conductivity of aluminum gallium nitride p-type is introduced into the transparent material (gallium oxide) that forms the transparent electrodes 35. However, in addition to the p-type dopant, a metal element that tends to adsorb (bind to) hydrogen atoms, e.g., nickel (Ni), palladium (Pd), or platinum (Pt), may be introduced. In that case, in order to form the transparent electrodes 35, a metal element, such as nickel, that tends to adsorb hydrogen atoms may be introduced beforehand into the target material for growing the transparent electrodes 35.

Then, the ultraviolet light emitting diode made of nitride semiconductors in accordance with this modified example achieves an increase in the light-extraction efficiency as well as a decrease in the operating voltage.

(Third Embodiment)

Hereinafter, a third embodiment of the present invention will be described with reference to the accompanying drawings.

Figure 8:
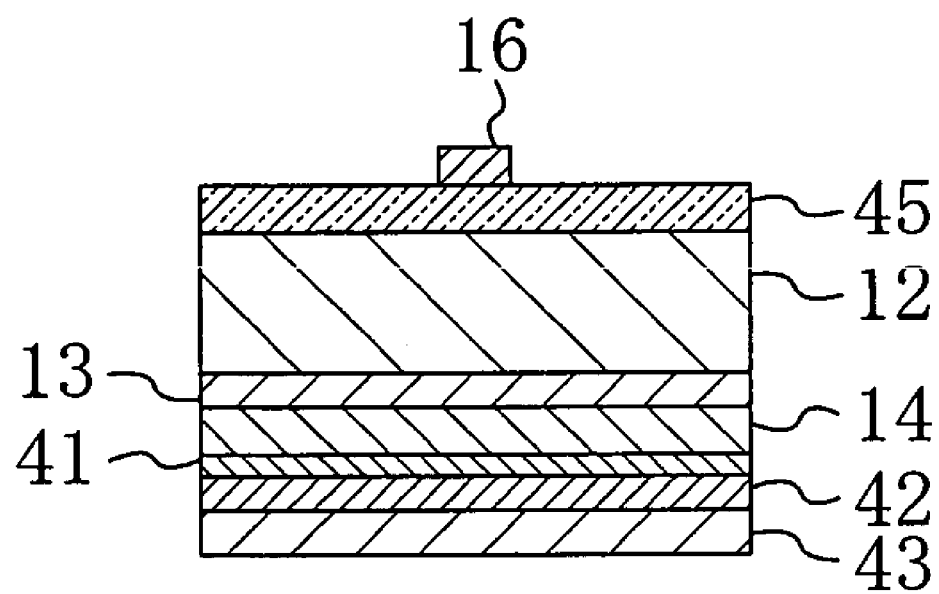
FIG. 8 is a cross-sectional view of a blue light emitting diode in accordance with a third embodiment of the present invention.

FIG. 8 illustrates a cross-sectional structure of a blue light emitting diode in accordance with the third embodiment of the present invention. In FIG. 8, the same members as those shown in FIGS. 1A and 1B are identified by the same reference numerals and the description thereof will be omitted herein.

As shown in FIG. 8, the blue light emitting diode in accordance with the third embodiment has a so-called N-up structure, in which a transparent electrode 45 is formed on a first semiconductor layer 12 made of n-type gallium nitride.

A second semiconductor layer 14 made of p-type gallium nitride is formed to the side of a MQW active layer 13 opposite to the first semiconductor layer 12, that is, the second semiconductor layer 14 is formed under the MQW active layer 13.

A p-type electrode 41 made of platinum having a thickness of about 100 nm is formed underneath the second semiconductor layer 14. Underneath the p-type electrode 41, a plated underlying layer 42 made of gold with a thickness of about 200 nm is formed. Underneath the plated underlying layer 42, a plated layer 43 made of gold having a thickness of about 50 μm is formed.

The third embodiment is characterized in that the impurity element introduced into the ITO that forms the transparent electrode 45 is silicon (Si), which is the impurity element introduced into the n-type first semiconductor layer 12. As will be described later, the silicon introduced into the ITO is diffused into the first semiconductor layer 12 through an annealing performed during fabrication process, so that contact resistance between the first semiconductor layer 12 and the transparent electrode 45 decreases.

It should be noted that the impurity element to introduce into the transparent electrode 45 is not limited to silicon, but a dopant, such as germanium (Ge), that renders the conductivity of gallium nitride n-type, may be used.

Further, in this embodiment, the substrate 11 of sapphire is removed from the semiconductor multilayer structure, and the plated layer 43 of gold is provided instead. Therefore, instead of the sapphire having inferior heat-dispersion characteristics, the plated layer 43 with excellent heat-dispersion characteristics is mounted on a submount, thus ensuring that the temperature characteristics of the device increases.

In this embodiment, although the N-up structure is employed as shown in FIG. 8, a so-called P-up structure, in which a transparent electrode is formed on the face of the p-type second semiconductor layer 14 opposite to the MQW active layer 13, may be adopted. In that case, magnesium is introduced into the transparent electrode as in the first embodiment. Then, as in the case of the N-up structure, a device having excellent heat-dispersion characteristics, and capable of operating at low operating voltage, is obtained.

Moreover, as in the second embodiment, aluminum gallium nitride may be used to form the semiconductor multilayer structure, so that the MQW active layer emits ultraviolet light. In that case, it is preferable that the transparent electrode 45 be made of gallium oxide, in particular, β-gallium oxide, into which tin oxide and an impurity that develops the same conductivity type as that of an impurity introduced into a semiconductor layer having an interface with the transparent electrode 45, have been introduced.

Furthermore, instead of the MQW active layer 13, a single-quantum well (SQW) active layer of indium gallium nitride having a thickness of about 20 nm may be provided.

Hereinafter, referring to the accompanying drawings, it will be described how to fabricate a blue light emitting diode having the above-mentioned structure.

FIGS. 9A through 9C and FIGS. 10A through 10C are cross-sectional views illustrating sequential process steps for fabricating a blue light emitting diode in accordance with the third embodiment of the present invention.

Figure 9A:
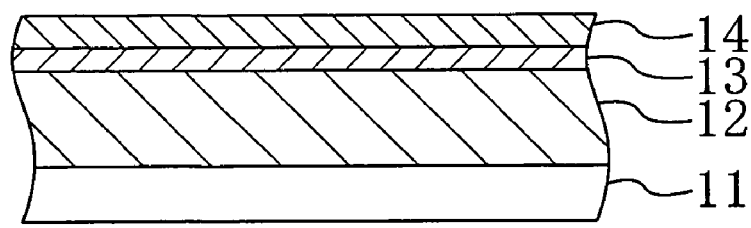
FIGS. 9A through 9C are cross-sectional views illustrating sequential process steps for fabricating the blue light emitting diode in accordance with the third embodiment of the present invention.

First, as shown in FIG. 9A, a low-temperature buffer layer (not shown) is grown on a substrate 11 made of sapphire by a MOVPE process. The substrate 11 is about 5.1 cm in diameter, and the plane orientation of the principal surface thereof is a (0001) plane. In the MOVPE process, trimethylgallium is used as a gallium source, ammonia is used as a nitrogen source, and hydrogen is used as a carrier gas, while the growth temperature is set at about 500° C. The buffer layer buffers a lattice mismatch between the sapphire and a first semiconductor layer 12, for example, grown on the sapphire. Subsequently, while mono-silane, which is a source material containing silicon as a donor impurity, is introduced, and with the growth temperature being set at about 1030° C., the first semiconductor layer 12 made of n-type gallium nitride having a thickness of about 4 μm is grown on the low-temperature buffer layer. Then, the supply of the mono-silane is stopped, and a barrier layer made of gallium nitride having a thickness of about 7 nm is grown on the first semiconductor layer 12. The carrier gas is then changed to nitrogen ($N_2$), and at the same time the growth temperature is lowered to about 800° C., and while trimethylindium as an indium source is also supplied, a well layer is grown on the barrier layer. The well layer has a thickness of about 3 nm and is made of indium gallium nitride, in which indium proportion is 30%. The barrier layer and the well layer are grown alternately in three pairs, thereby forming a MQW active layer 13. Then, cyclopentadienyl magnesium, which is a source material containing magnesium as an acceptor impurity, is introduced into the respective source gases of trimethylgallium and ammonia, and a second semiconductor layer 14 made of p-type gallium nitride having a thickness of about 0.8 μm is grown on the MQW active layer 13. After the second semiconductor layer 14 has been grown, the second semiconductor layer 14 is subjected to an annealing process performed for 20 minutes in a nitrogen ambient at a temperature of about 750° C. Through the annealing process, the p-type dopant introduced into the second semiconductor layer 14 is activated, which further reduces the resistance of the second semiconductor layer 14.

Figure 9B:
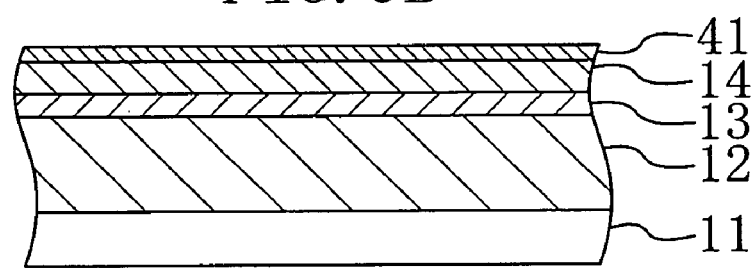

Subsequently, as shown in FIG. 9B, a p-type electrode 41 made of platinum is formed on the entire surface of the second semiconductor layer 14 by an EB deposition method, for example. In this process step, the material for the p-type electrode 41 is not limited to platinum, but may be any material that has excellent ohmic with respect to the p-type second semiconductor layer 14, and has high reflectance. For example, rhodium (Rh) or silver (Ag) may be used.

Figure 9C:
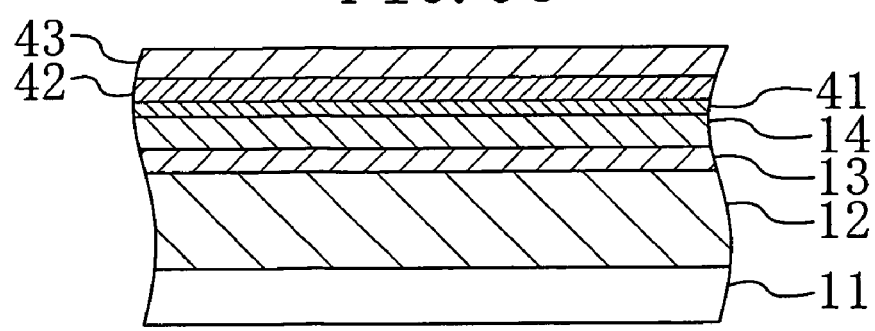

Next, as shown in FIG. 9C, a plated underlying layer 42 made of gold is grown on the entire surface of the p-type electrode 41 by an EB deposition method, for example. Then, a plated layer 43 made of gold having a thickness of about 50 μm is grown on the entire surface of the plated underlying layer 42 by a plating process.

Figure 10A:
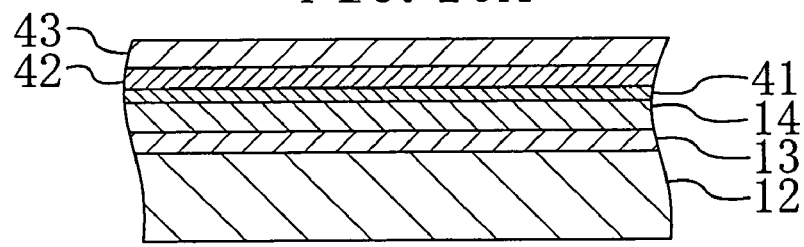
FIGS. 10A through 10C are cross-sectional views illustrating sequential process steps for fabricating the blue light emitting diode in accordance with the third embodiment of the present invention.

Thereafter, as shown in FIG. 10A, the substrate 11 is removed from the semiconductor multilayer structure with the plated layer 43 formed thereon. The substrate 11 may be removed, for example, by a polishing method, in which the substrate 11 is polished mechanically, or by a laser lift-off method, in which the substrate 11 is peeled off by irradiating the substrate 11 through its reverse face (that is, its face opposing the first semiconductor layer 12) with a laser beam having a wavelength that passes through sapphire and is absorbed by gallium nitride. In a case of using a laser lift-off method, since metal gallium is produced by the thermal decomposition of the gallium nitride, and adheres to the face of the first semiconductor layer 12 from which the substrate 11 has been peeled off, the attached metal gallium has to be removed using hydrochloric acid.

Figure 10B:
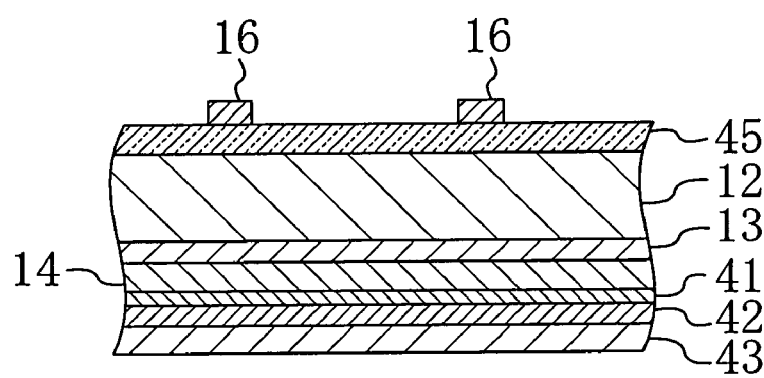

Subsequently, as shown in FIG. 10B, ITO, into which silicon, i.e., the same impurity element as the n-type dopant in the first semiconductor layer 12, has been introduced, is grown to a thickness of about 100 nm by a PLD method, for example, on the exposed face of the first semiconductor layer 12, that is, on the face of the first semiconductor layer 12 opposite to the MQW active layer 13, thereby forming a transparent electrode 45. In this process step, the impurity element to introduce into the material for the ITO may be a dopant that makes the first semiconductor layer 12 develop n-type conductivity. For example, germanium may be used in place of silicon.

Further, the material for the transparent electrode 45 is not limited to ITO, but may be any substance that is transparent with respect to light with a wavelength of about 470 nm, and tin oxide or zinc oxide may thus be used.

Furthermore, as in the second embodiment, if the diode is formed so that the MQW active layer 13 emits light having a wavelength in the ultraviolet region, the use of tin-oxide-added gallium oxide in forming the transparent electrode 45 makes the transparent electrode 45 transparent with respect to the wavelength of the emitted light.

Next, after the transparent electrode 45 has been grown, the transparent electrode 45 is subjected to an annealing process performed at a temperature of about 500° C. Through the annealing process, part of the silicon introduced into the ITO is diffused into the first semiconductor layer 12 through the interface between the transparent electrode 45 and the first semiconductor layer 12. This results in a decrease in the value of resistance in the first semiconductor layer 12 where the first semiconductor layer 12 is near the interface with the transparent electrode 45, thus leading to the formation of the transparent electrode 45 with small contact resistance with respect to the first semiconductor layer 12.

Figure 10C:
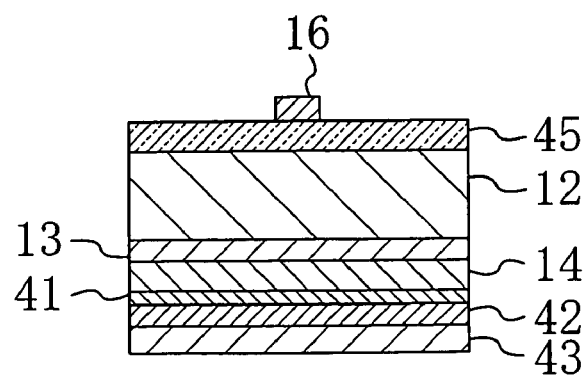

Then, as shown in FIG. 10C, bonding pads 16 for wire bonding are selectively formed on the transparent electrodes 45. The semiconductor multilayer structure is then divided into chips each about 300 μm square, thereby obtaining blue light emitting diodes.

As described above, in the blue light emitting diode having the N-up structure in accordance with the third embodiment, silicon, that is, the impurity with which the n-type first semiconductor layer 12 has been doped, is introduced beforehand into the transparent electrode 45 (n-type electrode), and then diffused into the first semiconductor layer 12 through an annealing process. This allows the transparent electrode 45 to have small contact resistance with respect to the first semiconductor layer 12, enabling the operating voltage to be decreased.

In addition, the substrate 11 made of sapphire is removed, and the plated layer 43 of gold is formed covering the p-type electrode 41 formed on the p-type second semiconductor layer 14. Therefore, when the plated layer 43 is mounted onto a submount, for example, a device having excellent heat-dispersion characteristics is obtained.

As a first modified example of the third embodiment, instead of introducing a dopant that determines the conductivity type of the gallium nitride into the transparent material (ITO) that forms the transparent electrode 45, a metal element which tends to adsorb (bind to) hydrogen atoms, e.g., nickel (Ni), palladium (Pd), or platinum (Pt), may be introduced into the transparent material.

Figure 11:
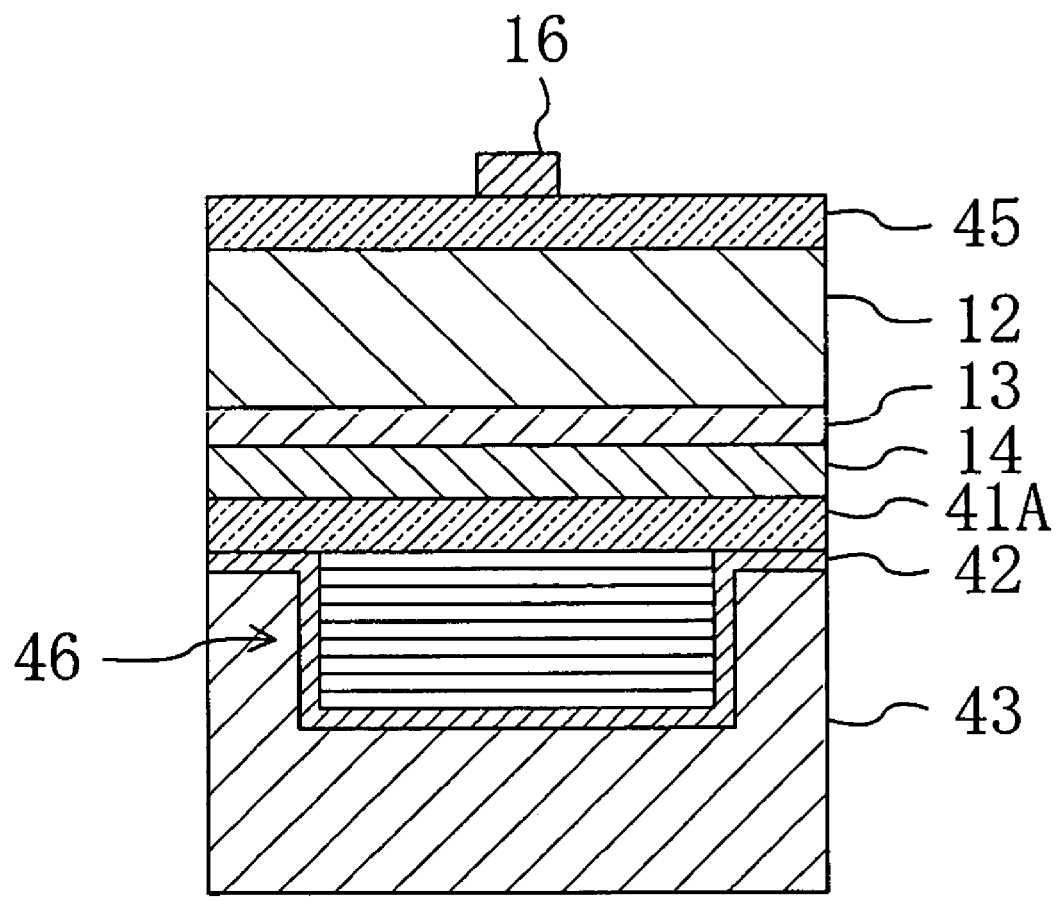
FIG. 11 is a cross-sectional view of a blue light emitting diode in accordance with a second modified example of the third embodiment of the present invention.

Further, as a second modified example, as shown in FIG. 11, the p-type electrode 41 made of platinum may be formed to be a transparent p-type electrode 41A made of transparent material, and a multilayer film (reflecting film) 46 made of dielectrics or semiconductors may be formed to the side of the transparent p-type electrode 41A opposite to the p-type second semiconductor layer 14.

In this case, it is also preferable that magnesium, which is the acceptor impurity in the second semiconductor layer 14, be introduced into the transparent p-type electrode 41A. Further, the optical reflectance of the multilayer film 46 is preferably 70% or higher.

(Fourth Embodiment)

Hereinafter, a fourth embodiment of the present invention will be described with reference to the accompanying drawings.

Figure 12:
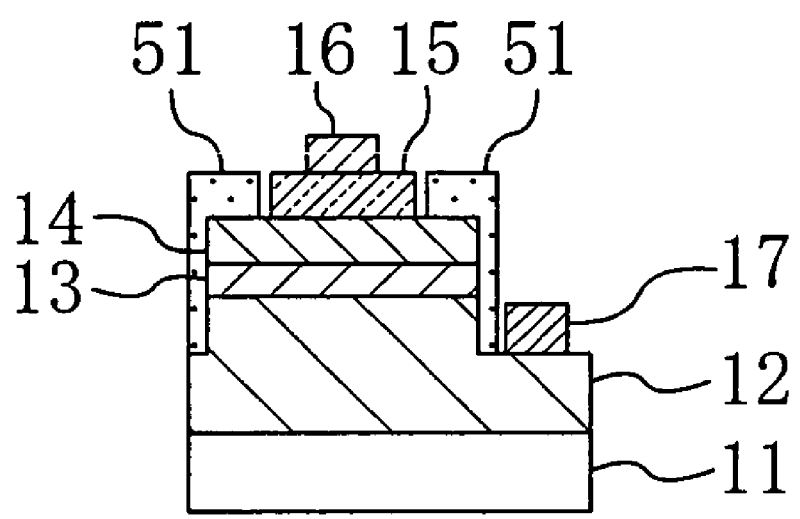
FIG. 12 is a cross-sectional view of a blue light emitting diode in accordance with a fourth embodiment of the present invention.

FIG. 12 illustrates a cross-sectional structure of a blue light emitting diode in accordance with the fourth embodiment of the present invention. In FIG. 12, the same members as those shown in FIGS. 1A and 1B are identified by the same reference numerals and the description thereof will be omitted herein.

In the blue light emitting diode in accordance with the fourth embodiment, a passivation film 51 made of magnesium-added silicon oxide ($SiO_2$) is formed so as to cover the upper surface of a second semiconductor layer 14 except the region where a transparent electrode 15 is formed, and to cover the respective exposed lateral faces of the second semiconductor layer 14, MQW active layer 13, and first semiconductor layer 12.

As described above, the lateral sides of the blue light emitting diode of the fourth embodiment are covered by the passivation film 51, which prevents current leakage due to the solder material flowing into the lateral sides of the semiconductor multilayer structure when the diode is mounted onto a submount, for example.

In addition, magnesium, which is the impurity element serving as a dopant in the p-type second semiconductor layer 14, is introduced into the transparent electrode 15 and the passivation film 51. Therefore, contact resistance between the transparent electrode 15 and the second semiconductor layer 14 is allowed to be reduced, thereby enabling low-voltage operation.

It should be noted that the impurity element to introduce into the transparent electrode 15 is not limited to magnesium, but zinc, beryllium, or any other dopant that makes the conductivity type of gallium nitride be p-type, may be used.

In addition, instead of the MQW active layer 13, a single-quantum well (SQW) active layer of gallium nitride having a thickness of about 20 nm may be provided.

Hereinafter, referring to the accompanying drawings, it will be described how to fabricate a blue light emitting diode having the above-mentioned structure.

FIGS. 13A through 13D and FIGS. 14A through 14C are cross-sectional views illustrating sequential process steps for fabricating a blue light emitting diode in accordance with the fourth embodiment of the present invention.

Figure 13A:
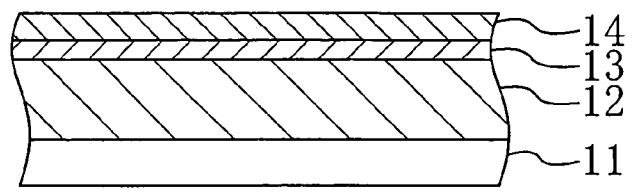
FIGS. 13A through 13D are cross-sectional views illustrating sequential process steps for fabricating the blue light emitting diode in accordance with the fourth embodiment of the present invention.

First, as shown in FIG. 13A, a low-temperature buffer layer (not shown) is grown on a substrate 11 made of sapphire by a MOVPE process. The substrate 11 is about 5.1 cm in diameter, and the plane orientation of the principal surface thereof is a (0001) plane. In the MOVPE process, trimethylgallium is used as a gallium source, ammonia is used as a nitrogen source, and hydrogen is used as a carrier gas, while the growth temperature is set at about 500° C. The low-temperature buffer layer buffers a lattice mismatch between the sapphire and a first semiconductor layer 12, for example, grown on the sapphire. Subsequently, while monosilane, which is a source material containing silicon as a donor impurity, is introduced, and with the growth temperature being set at about 1030° C., the first semiconductor layer 12 made of n-type gallium nitride having a thickness of about 4 µm is grown on the low-temperature buffer layer. Then, the supply of the mono-silane is stopped, and a barrier layer made of gallium nitride with a thickness of about 7 nm is grown on the first semiconductor layer 12. The carrier gas is then changed to nitrogen ($N_2$), and at the same time the growth temperature is lowered to about 800° C., and while trimethylindium as an indium source is also supplied, a well layer is grown on the barrier layer. The well layer has a thickness of about 3 nm, and is made of indium gallium nitride, in which indium proportion is 30%. The barrier layer and the well layer are grown alternately in three pairs, thereby forming a MQW active layer 13. Subsequently, cyclopentadienyl magnesium, which is a source material containing magnesium as an acceptor impurity, is introduced into the respective source gases of trimethylgallium and ammonia, and a second semiconductor layer 14 made of p-type gallium nitride having a thickness of about 0.8 µm is grown on the MQW active layer 13. After the second semiconductor layer 14 has been grown, the second semiconductor layer 14 is subjected to an annealing process performed for 20 minutes in a nitrogen ambient at a temperature of about 750° C. Through the annealing process, the p-type dopant introduced into the second semiconductor layer 14 is activated, which further decreases the resistance of the second semiconductor layer 14.

Figure 13B:
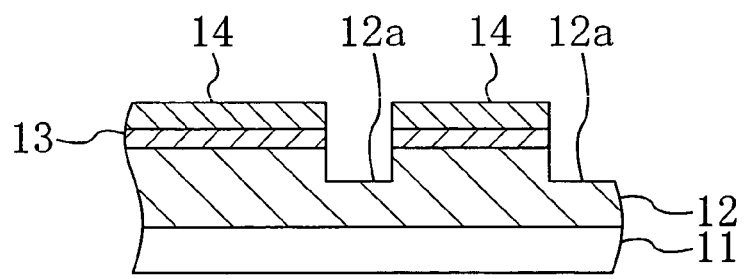

Then, as shown in FIG. 13B, the second semiconductor layer 14, the MQW active layer 13, and upper portions of the first semiconductor layer 12 are selectively removed by dry etching, such as RIE using, e.g., chlorine as an etching gas, or ICP etching, thereby forming n-type electrode formation regions 12a in the first semiconductor layer 12.

Figure 13C:
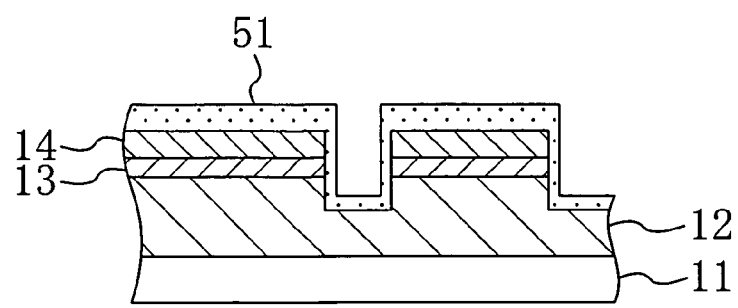

Next, as shown in FIG. 13C, a passivation film 51 made of magnesium-added silicon oxide is deposited to a thickness of about 300 nm on the entire surface of the second semiconductor layers 14 as well as on the n-type electrode formation regions 12a by a sputtering process, for example. Subsequently, the passivation film 51 is subjected to an annealing process performed at a temperature of about 500° C., so that the magnesium introduced into the passivation film 51 is diffused from the passivation film 51 across the interfaces into the upper portions of the second semiconductor layers 14, thereby decreasing the resistance value of the second semiconductor layers 14 in the vicinity of the interfaces with the passivation film 51. It should be noted that in order to introduce magnesium into the passivation film 51, if a sputtering process is employed, magnesium may be mixed into a target material, and if a sol-gel method is adopted, magnesium may be mixed into a source solution as an organic compound.

Figure 13D:
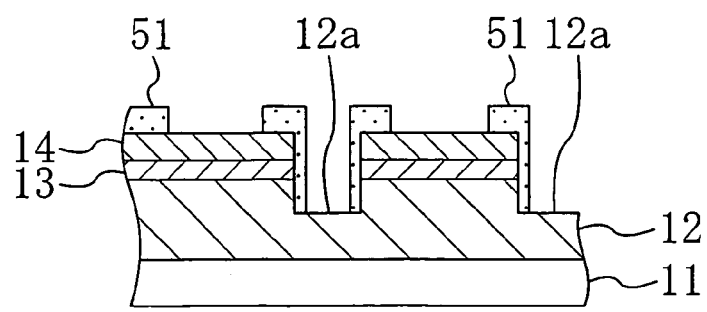

Next, as shown in FIG. 13D, transparent-electrode formation portions in the passivation film 51 on the second semiconductor layer 14, and portions of the passivation film 51 located on n-type electrode formation regions 12a are selectively removed by dry etching.

Figure 14A:
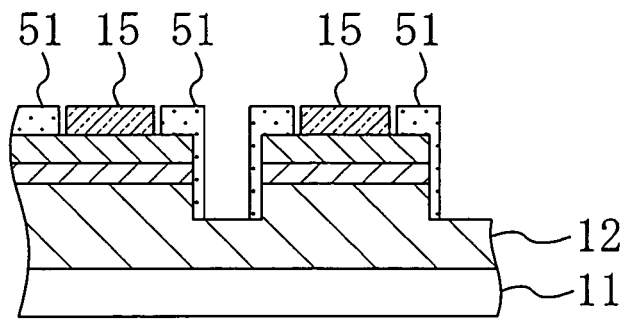
FIGS. 14A through 14C are cross-sectional views illustrating sequential process steps for fabricating the blue light emitting diode in accordance with the fourth embodiment of the present invention.

Subsequently, as shown in FIG. 14A, ITO, into which magnesium, that is, the impurity element serving as the p-type dopant in the second semiconductor layer 14, has been introduced, is selectively grown to a thickness of about 100 nm by a sputtering process or a PLD method, for example, on the exposed faces of the second semiconductor layers 14, thereby forming transparent electrodes 15. Thereafter, the transparent electrodes 15 are also subjected to an annealing process performed at a temperature of about 500° C. Through the annealing process, the magnesium introduced into the transparent electrodes 15 is further diffused from the transparent electrodes 15 across the interfaces into the upper portions of the second semiconductor layers 14, thereby further decreasing the value of resistance in the second semiconductor layers 14 where the second semiconductor layers 14 are near the interfaces with the transparent electrodes 15. This results in the formation of the transparent electrodes 15 having further reduced contact resistance, on the p-type second semiconductor layers 14.

It should be noted that the impurity element to introduce into the passivation film 51 and the transparent electrodes 15 is not limited to magnesium, but may be a dopant, such as zinc, that makes gallium nitride develop p-type conductivity.

Figure 14B:
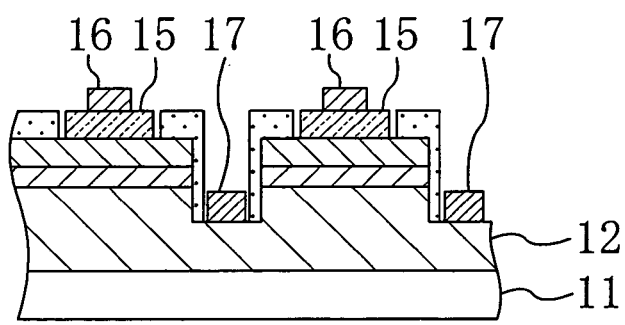

Then, as shown in FIG. 14B, bonding pads 16 for wire bonding are selectively formed on the respective transparent electrodes 15. Subsequently, titanium and gold are sequentially grown on the n-type electrode formation regions 12a in the first semiconductor layer 12, thereby forming n-type ohmic electrodes 17.

Figure 14C:
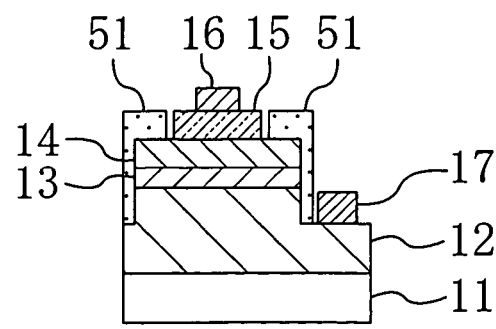

Next, as shown in FIG. 14C, the substrate 11 is divided into chips each 300 µm square, thereby obtaining blue light emitting diodes.

As described above, in the blue-light-emitting-diode fabrication method in accordance with the fourth embodiment, since magnesium, which is the p-type dopant in the second semiconductor layer 14 in contact with the transparent electrode 15, is introduced into the passivation film 51 and the transparent electrode 15, the magnesium is diffused into the second semiconductor layer 14 through the interfaces with those members by the annealing process performed after the deposition of the passivation film 51 and by the annealing process performed after the formation of the transparent electrode 15 formed after the removal of the passivation film 51. As a result, the value of resistance in the second semiconductor layer 14 where the second semiconductor layer 14 is in the vicinity of the interface with the transparent electrode 15 decreases significantly, such that contact resistance between the transparent electrode 15 and the second semiconductor layer 14 is reduced, enabling operation at low operating voltage.

In addition, since the passivation film 51 covers the semiconductor multilayer structure laterally, current leakage, caused by the solder material flowing into the lateral sides of the semiconductor multilayer structure during mounting process, is prevented, therefore resulting in an increase in yield.

As a first modified example of the fourth embodiment, instead of introducing a dopant that determines the conductivity type of the gallium nitride into the passivation film 51 and the transparent material (ITO) that forms the transparent electrode 15, a metal element which tends to adsorb (bind to) hydrogen atoms, e.g., nickel (Ni), palladium (Pd), or platinum (Pt), may be introduced into at least one of the passivation film 51 and the transparent material.

Further, the effects of the present invention are obtained by introducing an impurity that serves as a dopant in the nitride semiconductor, or a metal element that tends to adsorb hydrogen atoms, into just one of the passivation film 51 and the transparent electrode 15.

(Fifth Embodiment)

Hereinafter, a fifth embodiment of the present invention will be described with reference to the accompanying drawings.

Figure 15:
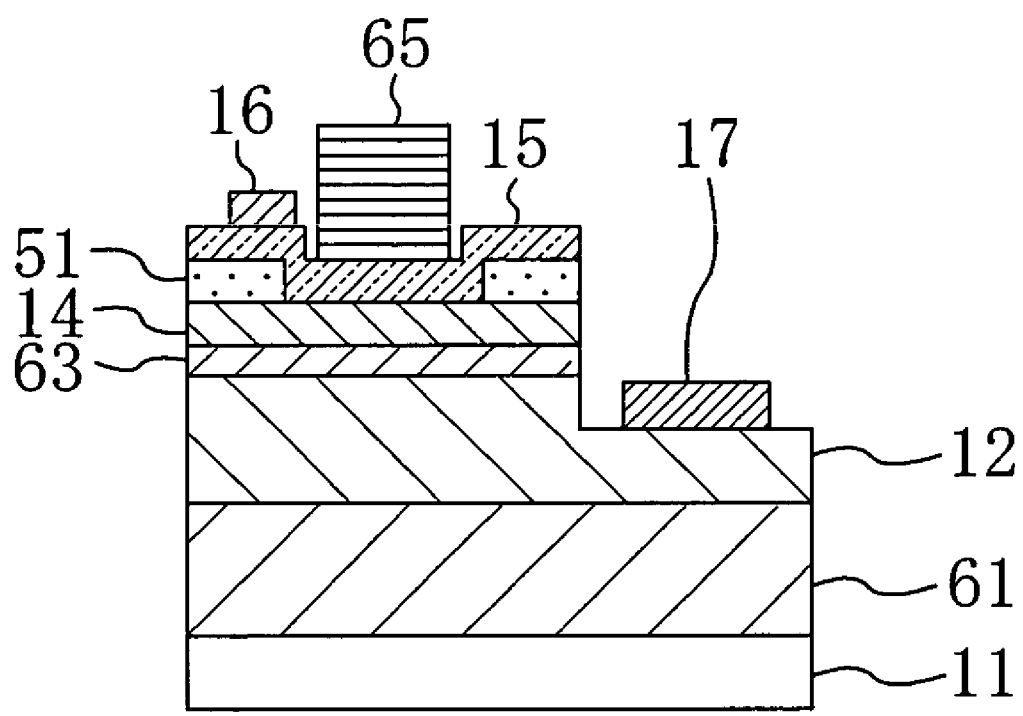
FIG. 15 is a cross-sectional view of a blue-light surface-emitting laser device in accordance with a fifth embodiment of the present invention.

FIG. 15 illustrates a cross-sectional structure of a blue-light surface-emitting laser device in accordance with the fifth embodiment of the present invention. In FIG. 15, the same members as those shown in FIGS. 1A and 1B are identified by the same reference numerals and the description thereof will be omitted herein.

As shown in FIG. 15, between a substrate 11 made of, e.g., sapphire and a first semiconductor layer 12 made of n-type gallium nitride, a first DBR (distributed bragg reflect) mirror 61 is formed by alternately stacking aluminum gallium nitride and gallium nitride one upon the other. Further, a second DBR mirror 65 made of dielectrics is formed in an optical waveguide portion on a transparent electrode 15 that has been doped with magnesium, for example.

Moreover, a passivation film 51 made of, e.g., magnesium-added silicon oxide is formed on the end portion of a second semiconductor layer 14, thereby forming a current confinement structure for confining operating current supplied from the transparent electrode 15.

In this embodiment, a MQW active layer 63 made of indium gallium nitride may have a SQW structure.

By the above-mentioned structure, contact resistance between the transparent electrode 15 and the p-type second semiconductor layer 14 is decreased as in the first embodiment, which enables the blue-light surface-emitting laser device to operate at low voltage.

In the fifth embodiment, a p-type dopant such as magnesium may be introduced into at least one of the transparent electrode 15 and the passivation film 51, but introducing the p-type dopant into both allows the effects of the present invention to be attained more notably.

Hereinafter, referring to the accompanying drawings, it will be described how to fabricate a blue-light surface-emitting laser device having the above-mentioned structure.

FIGS. 16A through 16C and FIGS. 17A through 17C are cross-sectional views illustrating sequential process steps for fabricating the blue-light surface-emitting laser device in accordance with the fifth embodiment of the present invention.

Figure 16A:
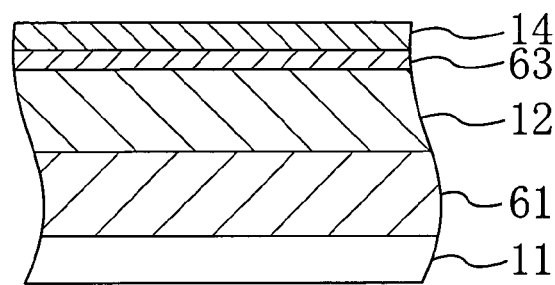
FIGS. 16A through 16C are cross-sectional views illustrating sequential process steps for fabricating the blue-light surface-emitting laser device in accordance with the fifth embodiment of the present invention.

First, as shown in FIG. 16A, a low-temperature buffer layer (not shown) is grown on a substrate 11 made of sapphire by a MOVPE process. The substrate 11 is about 5.1 cm in diameter, and the plane orientation of the principal surface thereof is a (0001) plane. In the MOVPE process, trimethylgallium is used as a gallium source, ammonia is used as a nitrogen source, and hydrogen is used as a carrier gas, while the growth temperature is set at about 500° C. The low-temperature buffer layer buffers a lattice mismatch between the sapphire and a first DBR mirror 61, for example, grown on the sapphire. Subsequently, with the growth temperature being set at about 1030° C., a first layer made of aluminum gallium nitride and a second layer made of gallium nitride are stacked alternately one upon the other, on the low-temperature buffer layer, thereby forming the first DBR mirror 61. In this process step, in growing the first layers, trimethylaluminum as an aluminum source is added to the source material. The first DBR mirror 61 is formed so as to have 99% or higher reflectance with respect to the wavelength of light emitted from a MQW active layer 63. Thereafter, mono-silane, which is a source material containing silicon as a donor impurity, is introduced, and a first semiconductor layer 12 made of n-type gallium nitride is grown. Then, the supply of the mono-silane is stopped, and a barrier layer made of gallium nitride is grown on the first semiconductor layer 12. The carrier gas is then changed to nitrogen ($N_2$), and at the same time the growth temperature is lowered to about 800° C., and while trimethylindium (TMI) as an indium source is also supplied, a well layer made of indium gallium nitride is grown on the barrier layer. The barrier layer and the well layer are grown, e.g., alternately in three pairs, thereby forming the MQW active layer 63. The MQW active layer 63 generates blue light having a wavelength of about 470 nm. Subsequently, cyclopentadienyl magnesium, which is a source material containing magnesium as an acceptor impurity, is introduced into the respective source gases of trimethylgallium and ammonia, and a second semiconductor layer 14 made of gallium nitride is grown on the MQW active layer 63. After the second semiconductor layer 14 has been grown, the second semiconductor layer 14 is subjected to an annealing process performed for 20 minutes in a nitrogen ambient at a temperature of about 750° C. Through the annealing process, the p-type dopant introduced into the second semiconductor layer 14 is activated, which further decreases the resistance of the second semiconductor layer 14.

Figure 16B:
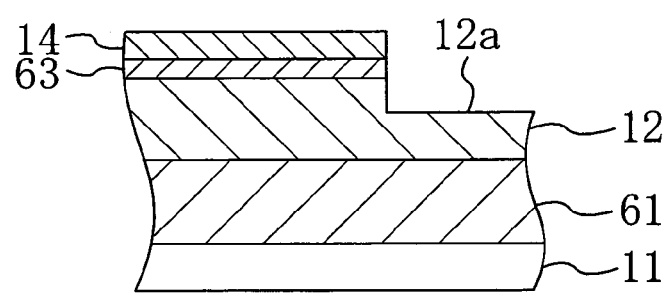
Figure 16C:
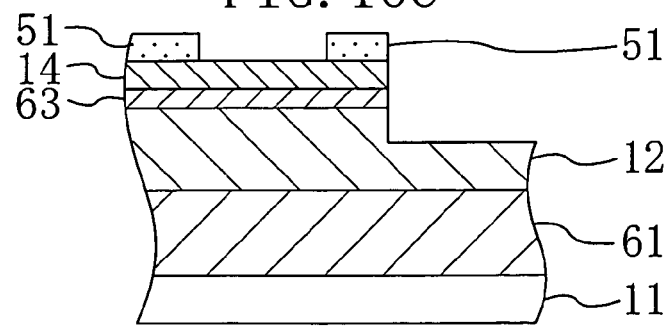

Then, as shown in FIG. 16B, the second semiconductor layer 14, the MQW active layer 63, and upper portions of the first semiconductor layer 12 are selectively removed by dry etching, such as RIE using, e.g., chlorine as an etching gas, or ICP etching, thereby forming an n-type electrode formation region 12a in the first semiconductor layer 12.

Next, a passivation film 51 made of magnesium-added silicon oxide is deposited to a thickness of about 300 nm on the entire surface of the second semiconductor layer 14 as well as on the n-type electrode formation region 12a by a sputtering process, for example. The passivation film 51 is then subjected to an annealing process performed at a temperature of about 500° C., so that the magnesium introduced into the passivation film 51 is diffused from the passivation film 51 across the interface into the upper portion of the second semiconductor layer 14, thereby lowering the resistance value of the second semiconductor layer 14 in the vicinity of the interface with the passivation film 51. Thereafter, a transparent-electrode formation portion of the passivation film 51 on the second semiconductor layer 14, and a portion of the passivation film 51 located on the n-type electrode formation region 12a are selectively removed by dry etching, thereby resulting in the state shown in FIG. 16C.

Figure 17A:
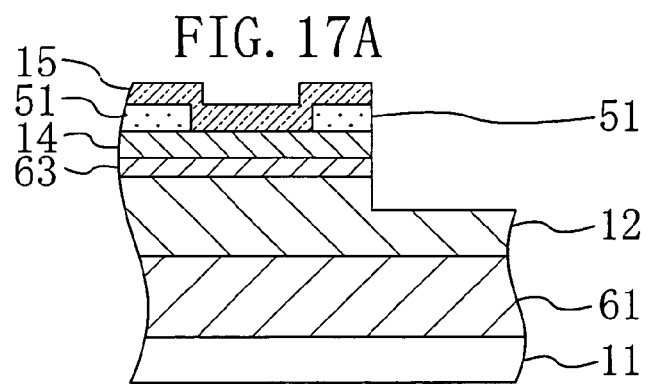
FIGS. 17A through 17C are cross-sectional views illustrating sequential process steps for fabricating the blue-light surface-emitting laser device in accordance with the fifth embodiment of the present invention.

Subsequently, as shown in FIG. 17A, ITO, into which magnesium, i.e., the impurity element serving as the p-type dopant in the second semiconductor layer 14, has been introduced, is selectively grown on the exposed face of the second semiconductor layer 14 by a sputtering process or a PLD method, for example, so as to cover the passivation film 51, thereby forming a transparent electrode 15. Thereafter, the transparent electrode 15 is also subjected to an annealing process performed at a temperature of about 500° C. Through the annealing process, the magnesium introduced into the transparent electrode 15 is further diffused from the transparent electrode 15 through the interface into the upper portion of the second semiconductor layer 14. This further reduces the value of resistance in the second semiconductor layer 14 near the interface with the transparent electrode 15. As a result, it is possible to form the transparent electrode 15 having further reduced contact resistance, on the p-type second semiconductor layer 14.

Figure 17B:
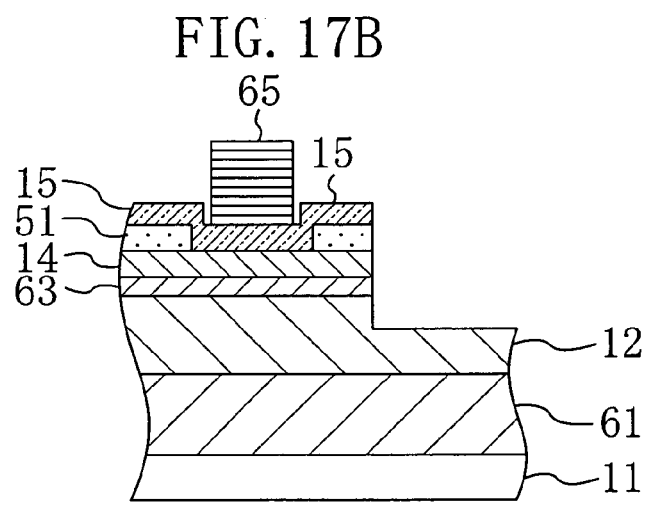

Then, as shown in FIG. 17B, a second DBR mirror 65 is formed by stacking a plurality of dielectric layers having different refraction indexes, on an optical waveguide portion of the transparent electrode 15, that is, on a portion of the transparent electrode 15 which is in contact with the second semiconductor layer 14.

Figure 17C:
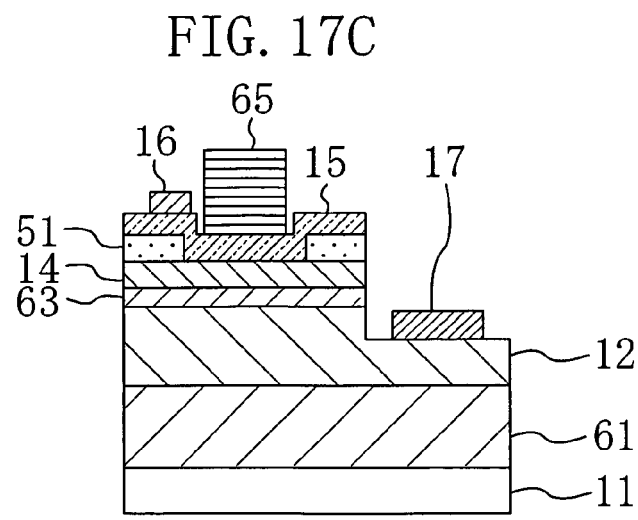
Figure 18:
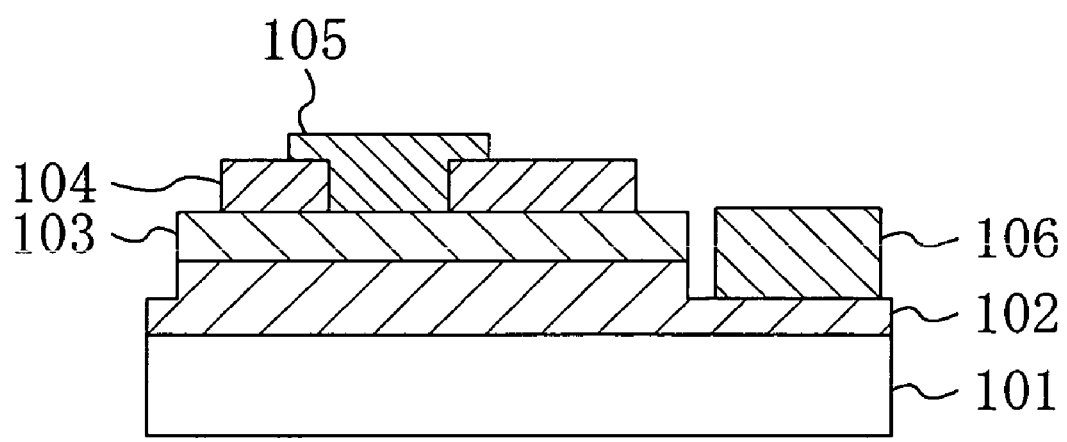
FIG. 18 is a cross-sectional view of a known blue light emitting diode.

Next, as shown in FIG. 17C, a bonding pad 16 for wire bonding is selectively formed on the transparent electrode 15 where the transparent electrode 15 is located on the passivation film 51. Subsequently, titanium and gold are sequentially grown on the n-type electrode formation region 12a in the first semiconductor layer 12, thereby forming an n-type ohmic electrode 17.

As described above, in the method for fabricating a blue-light surface-emitting laser device in accordance with the fifth embodiment, the passivation film 51 and the transparent electrode 15 are doped with magnesium that is the p-type dopant in the p-type second semiconductor layer 14 in contact with the transparent electrode 15. Therefore, the magnesium is diffused into the second semiconductor layer 14 across the interfaces with the passivation film 51 and the transparent electrode 15 by the respective annealing processes performed after the deposition of the passivation film 51 and after the formation of the transparent electrode 15 formed after the removal of the passivation film 51. This significantly reduces the value of resistance in the second semiconductor layer 14 where the second semiconductor layer 14 is near the interface with the transparent electrode 15, so that contact resistance between the transparent electrode 15 and the second semiconductor layer 14 is decreased, which enables operation at low operating voltage.

As a first modified example of the fifth embodiment, instead of introducing a dopant that determines the conductivity type of the gallium nitride into the passivation film 51 and the transparent material (ITO) that forms the transparent electrode 15, a metal element which tends to adsorb (bind to) hydrogen atoms, e.g., nickel (Ni), palladium (Pd), or platinum (Pt), may be introduced into at least one of the passivation film 51 and the transparent material.

Further, the effects of the present invention are obtained by introducing an impurity that serves as a dopant in the nitride semiconductor, or a metal element that tends to adsorb hydrogen atoms, into just one of the passivation film 51 and the transparent electrode 15.

Moreover, as a second modified example, the substrate 11 may be removed as in the third embodiment, and an n-type ohmic electrode may be formed on the face of the first DBR mirror 61 opposite to the first semiconductor layer 12. Further, in the case of removing the substrate 11, the first DBR mirror 61 may be etched so that part of the first semiconductor layer 12 is exposed, and an n-type ohmic electrode may be formed on the exposed portion. Furthermore, in the case of removing the substrate 11, instead of forming the first DBR mirror 61 made of the nitride semiconductors in the process steps for growing the semiconductor multilayer structure, a first DBR mirror 61 made of dielectric materials instead of the nitride semiconductors, may be formed on the face of the first semiconductor layer 12 opposite to the MQW active layer 63, after the substrate 11 has been removed.

In a case in which the first and second DBR mirrors 61 and 65 are formed out of dielectric materials, among silicon oxide ($SiO_2$), silicon nitride ($Si_3N_4$), niobium oxide ($Nb_2O_5$), hafnium oxide ($HfO_2$), titanium oxide ($TiO_2$) and tantalum oxide ($Ta_2O_5$), at least two substances having different refraction indexes may be selected as the dielectric materials.

Further, in the first through fifth embodiments, although the principal surface of the substrate 11 is not processed at all, a mask for selective growth may be formed on the substrate 11, or steps may be created in the upper portion of the substrate 11, so that a selective epitaxial lateral overgrowth (ELOG) may be performed.

Furthermore, in the foregoing embodiments, the material for the substrate is not limited to sapphire, but silicon carbide (SiC), gallium arsenide (GaAs), zinc oxide (ZnO), spinel, or silicon (Si), for example, may be used.

Moreover, in the foregoing embodiments, although light emitting diodes and surface-emitting laser devices are described as surface-emitting nitride semiconductor light-emitting devices, any semiconductor light emitting devices, in which a transparent electrode is provided on a nitride semiconductor, produce the effects of the present invention.

What is claimed is:

1. A semiconductor light emitting device comprising:
   a semiconductor multilayer structure comprising a plurality of Group III–V nitride semiconductor layers including two semiconductor layers of different conductivity types, and
   a transparent electrode formed on the semiconductor multilayer structure,
   wherein the transparent electrode contains an impurity element developing the same conductivity type as that of an impurity element introduced into a semiconductor in the semiconductor multilayer structure, said semiconductor having an interface with the transparent electrode, and
   the impurity element contained in the transparent electrode is diffused into the semiconductor having the interface with the transparent electrode, causing contact resistance between the semiconductor and the transparent electrode to decrease.

2. The semiconductor light emitting device of claim 1, wherein the impurity elements are magnesium, zinc, beryllium, or silicon.

3. The semiconductor light emitting device of claim 1, wherein the transparent electrode is made of indium tin oxide or gallium oxide.

4. The semiconductor light emitting device of claim 1, further comprising, on the transparent electrode, a multilayer film that reflects light emitted from the semiconductor multilayer structure, and includes a plurality of dielectric layers.

5. The semiconductor light emitting device of claim 4, wherein the multilayer film is made of at least two substances among silicon oxide, silicon nitride, niobium oxide, hafnium oxide, titanium oxide and tantalum oxide.

6. The semiconductor light emitting device of claim 1, further comprising:
   a multilayer film, which is formed to the side of the semiconductor multilayer structure opposite to the transparent electrode, and which reflects light emitted from the semiconductor multilayer structure, and includes a plurality of dielectric layers or a plurality of semiconductor layers.

7. The semiconductor light emitting device of claim 6, wherein the multilayer film is made of at least two substances among silicon oxide, silicon nitride, niobium oxide, hafnium oxide, titanium oxide and tantalum oxide.

* * * * *